United States Patent
Ueda et al.

(10) Patent No.: US 8,018,298 B2
(45) Date of Patent: Sep. 13, 2011

(54) ACOUSTIC WAVE DEVICE, FILTER AND DUPLEXER

(75) Inventors: Masanori Ueda, Kawasaki (JP);
Masafumi Iwaki, Kawasaki (JP);
Tokihiro Nishihara, Kawasaki (JP);
Shinji Taniguchi, Kawasaki (JP); Go Endo, Yokohama (JP); Yasuo Ebata, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 157 days.

(21) Appl. No.: 11/896,470

(22) Filed: Aug. 31, 2007

(65) Prior Publication Data
US 2008/0055021 A1 Mar. 6, 2008

(30) Foreign Application Priority Data
Sep. 1, 2006 (JP) .................. 2006-237287

(51) Int. Cl.
*H03H 9/70* (2006.01)
*H03H 9/54* (2006.01)
(52) U.S. Cl. ...................... 333/133; 333/189
(58) Field of Classification Search .............. 333/189, 333/133
See application file for complete search history.

(56) References Cited

U.S. PATENT DOCUMENTS

| | | | | |
|---|---|---|---|---|
| 4,344,010 A | * | 8/1982 | Vig et al. | 310/361 |
| 5,231,327 A | * | 7/1993 | Ketcham | 310/366 |
| 5,294,862 A | * | 3/1994 | Banno et al. | 310/366 |
| 5,351,021 A | * | 9/1994 | Masaie et al. | 333/189 |
| 6,987,433 B2 | * | 1/2006 | Larson et al. | 333/189 |
| 7,140,084 B2 | * | 11/2006 | Yamada et al. | 29/25.35 |
| 7,299,529 B2 | * | 11/2007 | Ginsburg et al. | 29/25.35 |
| 7,365,619 B2 | * | 4/2008 | Aigner et al. | 333/189 |
| 2004/0100342 A1 | * | 5/2004 | Nishihara et al. | 333/133 |
| 2006/0290446 A1 | * | 12/2006 | Aigner et al. | 333/133 |
| 2008/0007369 A1 | * | 1/2008 | Barber et al. | 333/189 |
| 2008/0055020 A1 | * | 3/2008 | Handtmann et al. | 333/189 |
| 2008/0252398 A1 | * | 10/2008 | Jamneala et al. | 333/189 |
| 2008/0297278 A1 | * | 12/2008 | Handtmann et al. | 333/189 |

FOREIGN PATENT DOCUMENTS

| | | | |
|---|---|---|---|
| JP | 2002-076822 | * | 3/2002 |
| JP | 2004-173191 | * | 6/2004 |

OTHER PUBLICATIONS

P.D. Bradley, SM, R. Ruby, A. Barfknecht, F. Geefay, C. Han, G. Gan, Y. Oshmyansky, "*A 5 mm×mm×1.37 mm Hermetic FBAR Duplexer for PCS Handsets with Wafer-Scale Packaging*", 2002, pp. 907-910, IEEEultrasonics Symposium.

* cited by examiner

*Primary Examiner* — Barbara Summons
(74) *Attorney, Agent, or Firm* — Arent Fox LLP

(57) ABSTRACT

An acoustic wave device includes a first resonator having a piezoelectric substance sandwiched between a pair of electrodes in a direction of an c-axis orientation or a polarization axis, and a second resonator that is connected in series and has another piezoelectric substance sandwiched another pair of electrodes so that one of the another pair of electrodes located in the direction of the c-axis orientation or the polarization axis is at a potential equal to that of one of the pair of electrodes of the first resonator in the direction of the c-axis orientation or the polarization axis.

11 Claims, 20 Drawing Sheets

DIRECTION OF C-AXIS ORIENTATION

SECONDARY DISTORTION VOLTAGE

DIRECTION OF C-AXIS ORIENTATION

DIRECTION OF C-AXIS ORIENTATION

WHEN A1a = A1b    |V1a| > |V1b|
WHEN A1a < A1b    |V1a| ≈ |V1b|  (DEPEND ON OPTIMIZING OF AREA)

ACOUSTIC WAVE DEVICE, FILTER AND DUPLEXER

BACKGROUND OF THE INVENTION

1. Field of the Invention

The present invention relates to an acoustic wave device, a filter and a duplexer, and more particularly, to an acoustic wave device having a piezoelectric substance sandwiched between a pair of electrodes, a filter and a duplexer using such an acoustic wave device.

2. Description of the Related Art

There has been an increasing demand for light and compact resonators and filters using such resonators as wireless devices, which may be typically mobile communication equipment, have been spread rapidly. In the part, filters having surface acoustic wave (SAW) devices were mainly used. Recently, an attention to an acoustic wave device having a piezoelectric substance sandwiched between a pair of electrodes has been drawn because the acoustic wave device of this type has good performance at high frequencies in the order of GHz and can be miniaturized monolithically. Examples of the above-mentioned acoustic wave device are piezoelectric thin-film resonators such as an FBAR (Film Balk Acoustic Resonator) and an SMR (Solidly Mounted Resonator).

A filter structure as shown in FIG. 1 is frequently used in which resonators are arranged in series and parallel so as to form a ladder. More specifically, series resonators S1 through S3 are arranged in series between an input terminal Tin and an output terminal Tout. Parallel resonators P1 and P2 are connected between nodes between the adjacent series resonators and ground. The ladder type filter thus configured has advantages that the insertion loss and the degree of out-of-band suppression can easily be adjusted by changing the number of stages and the capacitance ratio of resonators arranged in series and parallel. It is therefore easy to design the insertion loss and the degree of out-of-band suppression.

The following document discloses a ladder type filter using FBARs in which two resonators are arranged in series between adjacent nodes or between an node and a terminal: 2002 IEEE ULTRASONICS SYMPOSIUM, pp. 907-910.

As is known, IMD (Inter Modulation Distortion) or CMD (Cross Modulation Distortion) takes place in the filters used in mobile communications or high-frequency wireless communications. Particularly, IMD or CMD is serious in devices that handle high power, such as duplexers. The IMD and CMD depend on non-linearity resulting from the device (resonator) structure and material. When signals of different frequencies are applied to the filter or duplexer, new unwanted frequency components will be generated in addition to the normal frequency response of the applied signals. The new frequency components may serve as noise in the receive filter.

FIG. 2 shows a variation in which the series resonator S1 shown in FIG. 1 is replaced by two resonators S1a and S1b connected in series. In this manner, each of the resonators between the adjacent nodes (S1-S3 in FIG. 1) and those between the nodes and ground (P1 and P2) may be divided into multiple resonators (S1a and S1b in FIG. 2). The use of divided resonators contributes improvements in power durability and IMD and CMD in high-power transmission. However, in practice, a secondary distortion still remains.

SUMMARY OF THE INVENTION

The present invention has been made in view of the above-mentioned circumstances, and provides an acoustic wave device capable of suppressing the occurrence of secondary distortion.

According to an aspect of the present invention, there is provided an acoustic wave device having: a first resonator having a piezoelectric substance sandwiched between a pair of electrodes in a direction of an c-axis orientation or a polarization axis; and a second resonator that is connected in series and has another piezoelectric substance sandwiched another pair of electrodes so that one of the another pair of electrodes located in the direction of the c-axis orientation or the polarization axis is at a potential equal to that of one of the pair of electrodes of the first resonator in the direction of the c-axis orientation or the polarization axis.

According to another aspect of the present invention, there is provided an acoustic wave device having: a first resonator having a piezoelectric substance sandwiched between a pair of electrodes in a direction of an c-axis orientation or a polarization axis; and a second resonator that is connected in parallel and has another piezoelectric substance sandwiched another pair of electrodes so that one of the another pair of electrodes located in the direction of the c-axis orientation or the polarization axis is at a potential opposite to that of one of the pair of electrodes of the first resonator in the direction of the c-axis orientation or the polarization axis.

According to a further aspect of the present invention, there are provided a filter and a duplexer using the above-mentioned acoustic wave device.

BRIEF DESCRIPTION OF THE DRAWINGS

Embodiments of the present invention will now be described with reference to the following figures, in which.

DETAILED DESCRIPTION

A description will now be given of embodiments of the present invention.

First Embodiment

Figures 3A, 3B:
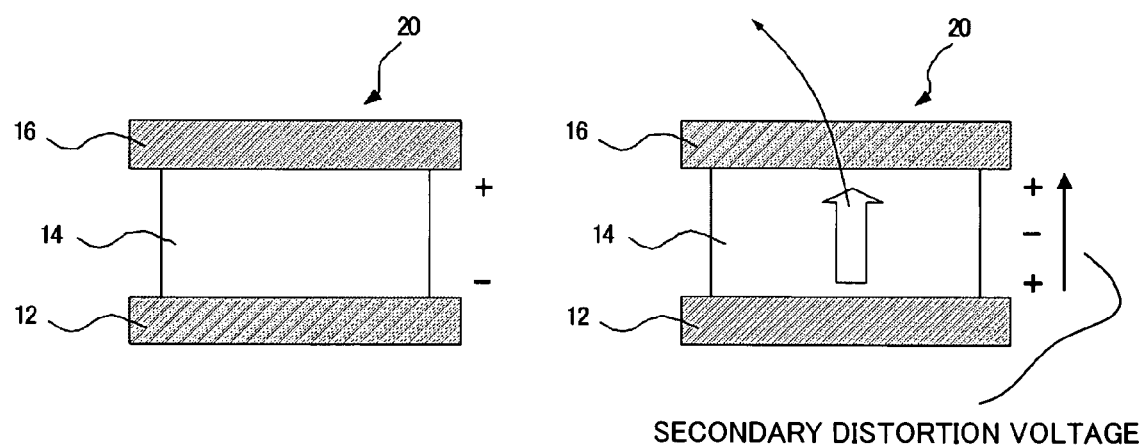
FIG. 3A schematically shows an FBAR.
FIG. 3B shows a secondary distortion caused in the FBAR.

FIGS. 3A and 3B schematically show an FBAR formed by a resonator 20 in which a piezoelectric substance 14 is sandwiched between a pair of electrodes (which is composed of a lower electrode 12 and an upper electrode 16). The FBAR or SMR has a thickness of the piezoelectric substance 14 equal to half the wavelength (λ) of the resonance frequency. Thus, as shown in FIG. 3A, the piezoelectric substance 14 is excited so that one of the upper and lower surfaces of the piezoelectric substance 14 is polarized positively or negatively, and the other is polarized the other of positively or negatively. As shown in FIG. 3B, the wavelength of the frequency of the secondary distortion corresponds to the thickness of the piezoelectric substance 14. Thus, the piezoelectric substance 14 is excited so that both the upper and lower surfaces of the piezoelectric substance 14 are polarized identically. In the example shown in FIG. 3B, both the upper and lower surfaces of the piezoelectric substance 14 are polarized positively. When the piezoelectric substance 14 has symmetry, the upper and lower electrodes 16 and 12 are at an identical potential in the secondary mode. In this case, the distortion component shown in FIG. 3 does not occur theoretically.

However, the secondary distortion will take place if the resonator 20 is structured as follows. The piezoelectric substance 14 of the resonator 20 is made of aluminum nitride (AlN) or zinc oxide (ZnO). The piezoelectric substance 14 is sandwiched between the lower electrode 12 and the upper electrode 16 in the c-axis orientation direction of the piezoelectric substance 14. In this case, the symmetry in the c-axis orientation direction is distorted, and the electric field may have uneven distribution. An arrow in FIG. 3B indicates the orientation direction of the c-axis. The uneven distribution of the electric field causes a potential difference between the upper and lower surfaces of the piezoelectric substance 14. A voltage thus generated is referred to as secondary distortion voltage, and is indicated by another arrow arranged along the right side of the piezoelectric substance 14. In FIG. 3B, the c-axis is oriented in the direction from the lower electrode 12 to the upper electrode 16, so that the secondary distortion voltage is generated in the above direction.

Since existence of structural asymmetry is essential for that of the piezoelectricity, the piezoelectric substance inherently produces even-order distortion as well as odd-order distortion by the applied electric field. It should be noted that polarity of the even-order distortion is determined by the direction of the crystal axis and is independent of that of the electric field.

Figure 4A:
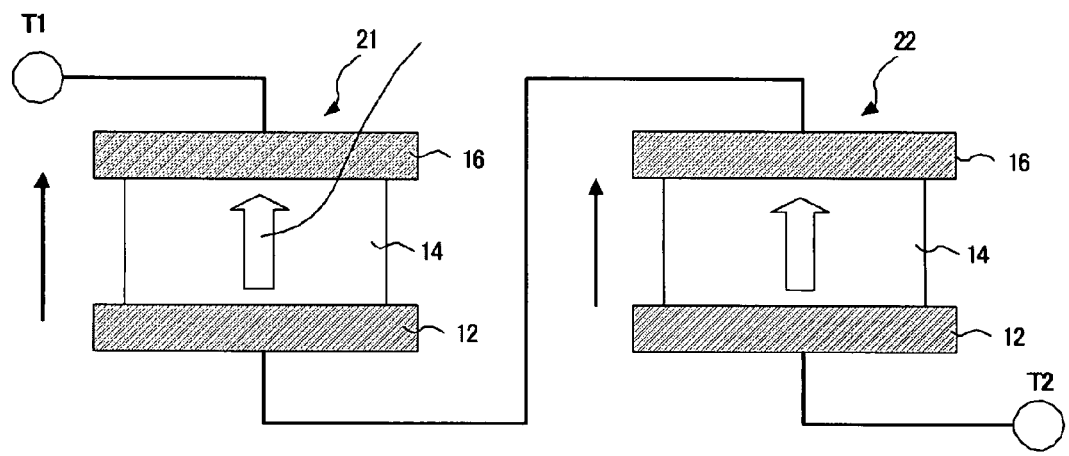
FIG. 4A shows an acoustic wave device of a first comparative example.
Figure 4B:
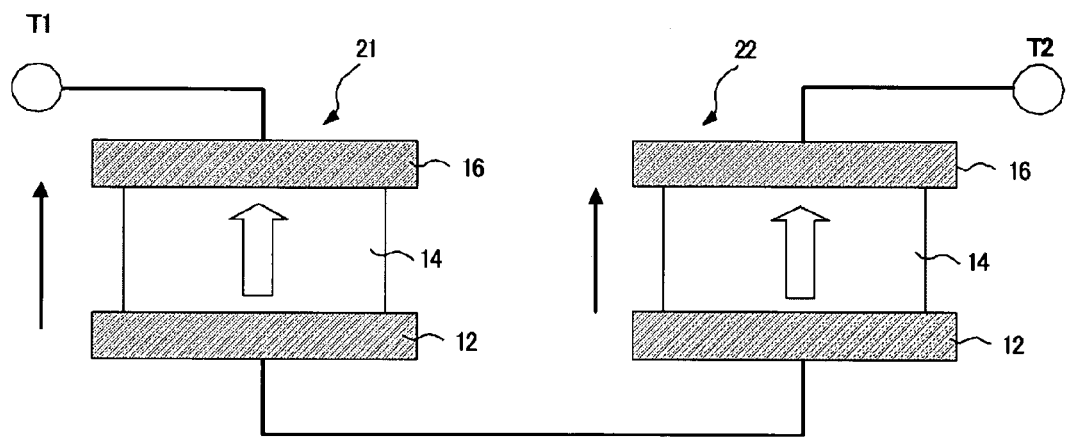
FIG. 4B shows an acoustic wave device of a first embodiment.

FIG. 4A shows a comparative example, and FIG. 4B shows the first embodiment. Each of the arrangements shown in FIGS. 4A and 4B employs two FBARs mentioned above. Referring to FIG. 4A, the comparative example has two resonators, namely, first and second resonators 21 and 22 connected in series so that the potential of the electrode in the reverse direction of the c-axis orientation direction in one of the first and second resonators is equal to that of the electrode in the c-axis orientation direction in the other resonator. That is, the first and second resonators 21 and 22 are connected in series so that the potential of the electrode 12 in the reverse direction of the c-axis orientation direction in the first resonator 21 is equal to that of the electrode 16 in the c-axis orientation direction in the second resonator 22. Thus, the secondary distortion voltage of the first resonator 21 and that of the second resonator 22 are added in the direction from a terminal T2 to a terminal T1. This means that the whole secondary distortion voltage is increased.

In contrast, referring to FIG. 4B, the first embodiment has the first and second resonators 21 and 22 connected in series so that the potential of the electrode in the reverse direction of the c-axis orientation direction in one of the first and second resonators is equal to that of the electrode in the reverse direction in the c-axis orientation direction in the other resonator. That is, the first and second resonators 21 and 22 shown in FIG. 4B are connected in series so that the potential of the electrode 12 in the reverse direction of the c-axis orientation direction in the first resonator 21 is equal to that of the electrode 12 in the reverse direction in the c-axis orientation direction in the other second resonator 22. Thus, the secondary distortion voltage in the first resonator 21 is applied from the terminal T2 to T1, and that in the second resonator 22 is applied from T1 to T2. Thus, the secondary distortion voltages of the first and second resonators 21 and 22 are mutually canceled, so that the whole secondary distortion voltage can be suppressed.

Second Embodiment

Figure 5A:
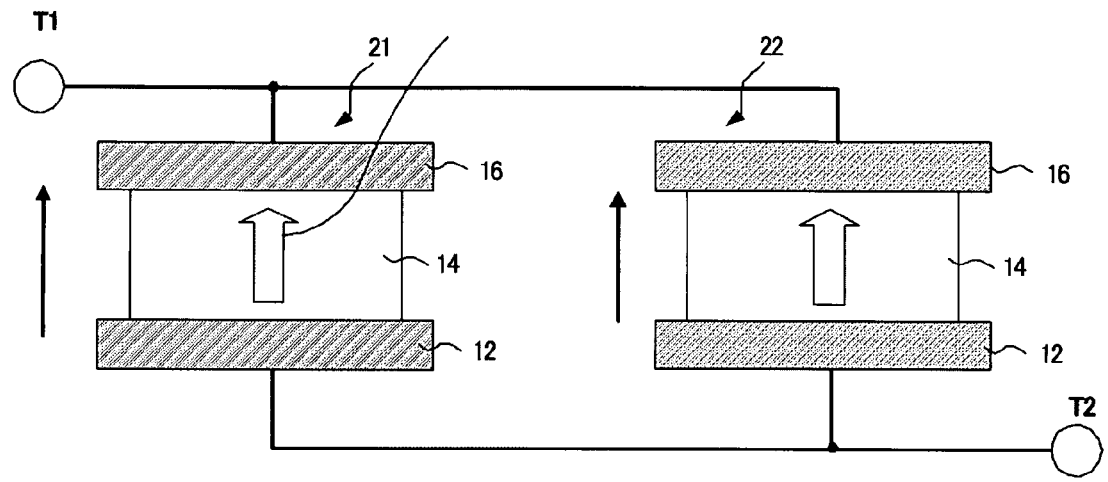
FIG. 5A shows an acoustic wave device of a second comparative example.
Figure 5B:
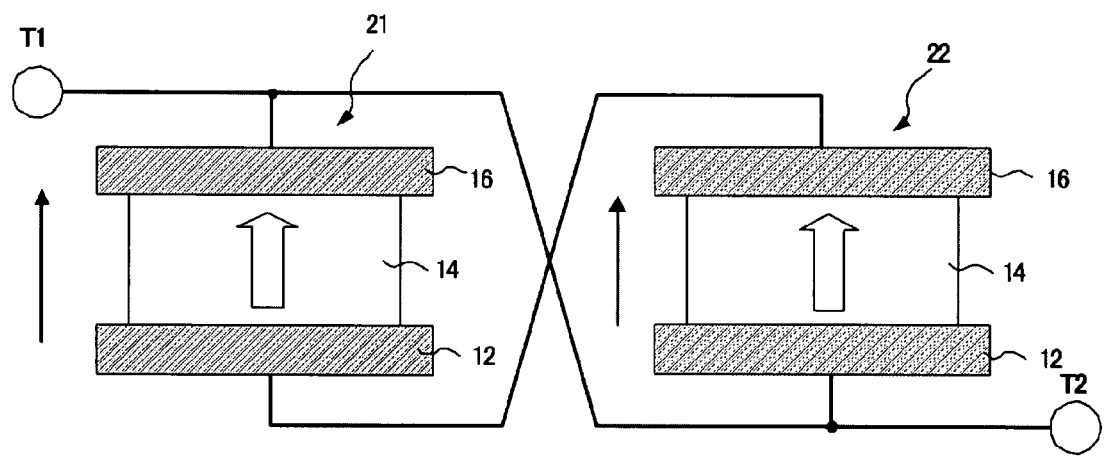
FIG. 5B shows an acoustic wave device of a second embodiment.

FIGS. 5A and 5B respectively show a second comparative example and a second embodiment. Each of the arrangements shown in FIGS. 5A and 5B employs two FBARs mentioned before. Referring to FIG. 5A, the first resonator 21 and the second resonator 22 of the second comparative example are connected in parallel so that the electrodes of the first and second resonators 21 and 22 in the c-axis directions are at an identical potential. That is, the first and second resonators 21 and 22 are connected so that the upper electrodes 16 of the first and second resonators 21 and 22 in the c-axis orientation direction are at an identical potential. The electrodes 12 of the first and second resonators 21 and 22 in the reverse direction of the c-axis orientation direction are connected so as to have an identical potential. Thus, the secondary distortion voltages of the first and second resonators 21 and 22 are applied from the terminal T2 to T1, so that the whole second distortion voltage is increased.

In contrast, as shown in FIG. 5B, the first and second resonators 21 and 22 of the second embodiment are connected in parallel so that the electrodes of the first and second resonators 21 and 22 in the c-axis orientation direction are at opposite potentials. That is, the upper electrode 16 of the first resonator 21 and the lower electrode 12 of the second resonator 22 are connected, and the lower electrode 12 of the first resonator 21 and the upper electrode of the second resonator 22 are connected. Thus, the secondary distortion voltage of the first resonator 21 is applied from the terminal T2 to T1, and the secondary distortion voltage of the second resonator 22 is applied from the terminal T1 to T2. As a result, the secondary distortion voltages of the first and second resonators 21 and 22 are mutually canceled, so that the whole secondary distortion voltage can be suppressed. The specific connections between the electrodes of the divided resonators function to restrain the secondary distortions.

Third Embodiment

Figure 1:
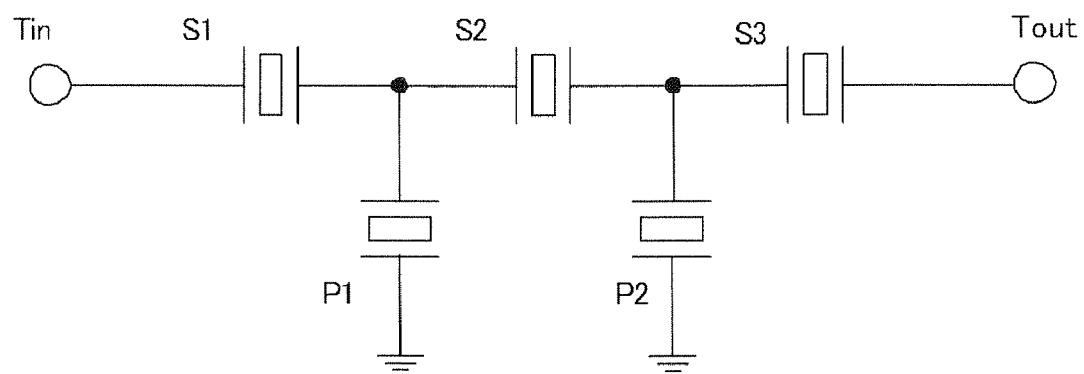
FIG. 1 is a circuit diagram of a conventional ladder type filter.
Figure 2:
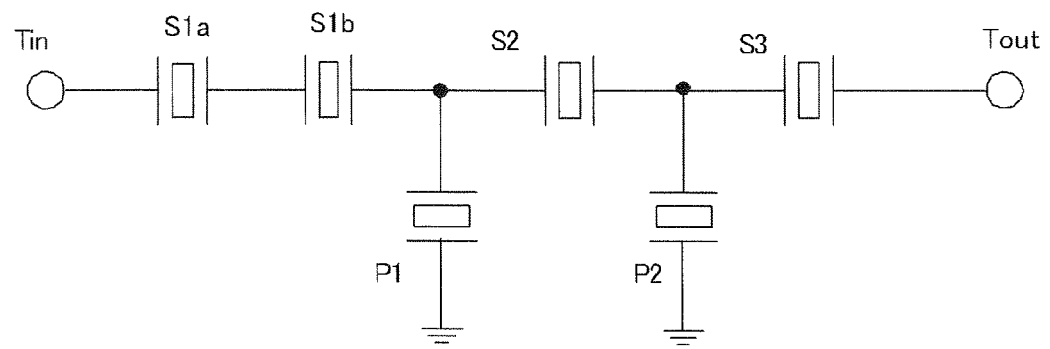
FIG. 2 is a circuit diagram of another conventional ladder type filter in which a resonator is divided into two resonators.
Figure 6:
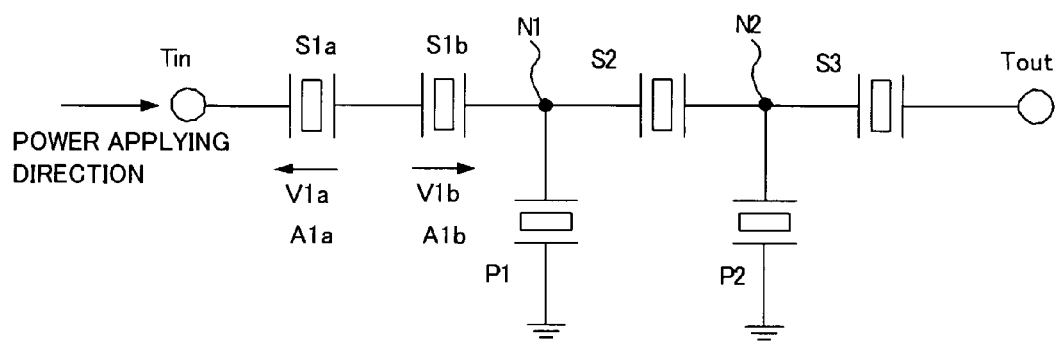
FIG. 6 is a circuit diagram of a filter of a third embodiment.

A third embodiment is an exemplary ladder type filter in which a series FBAR is divided into multiple parts. FIG. 6 shows a ladder type filter of the third embodiment. Referring to FIG. 6, the series resonator S1 is divided into the first resonator S1a and the second resonator S1b, as in the case of the arrangement shown in FIG. 2.

Figure 7A:
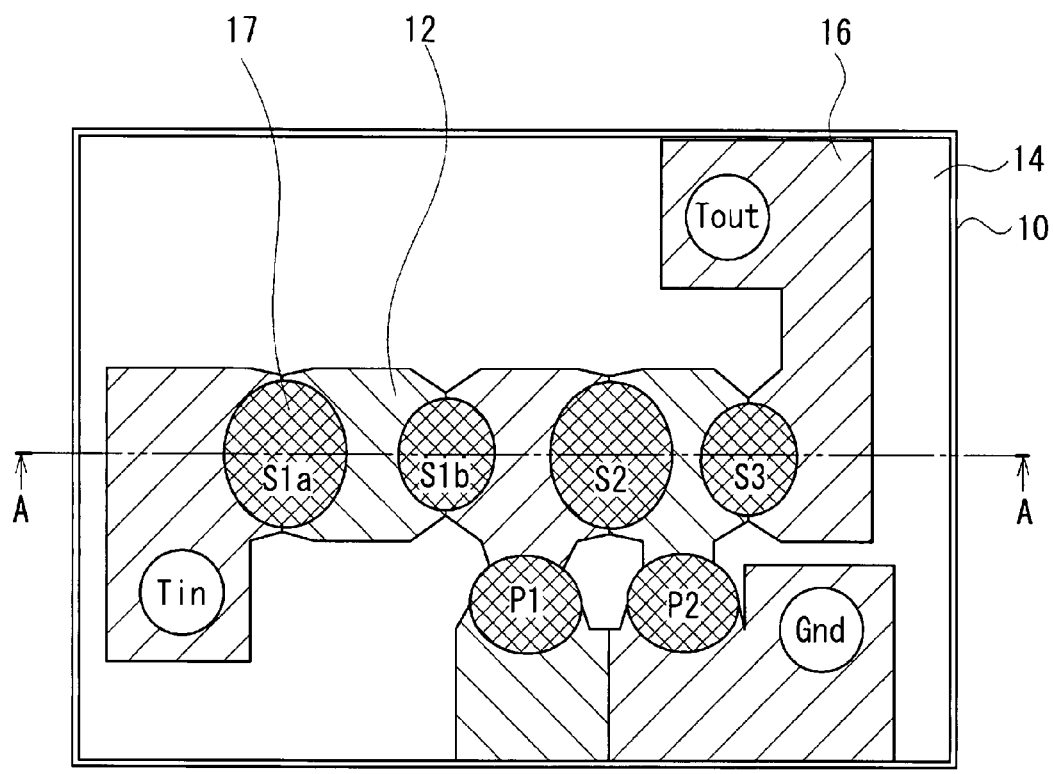
FIG. 7A is a plan view of the filter of the third embodiment.
Figure 7B:
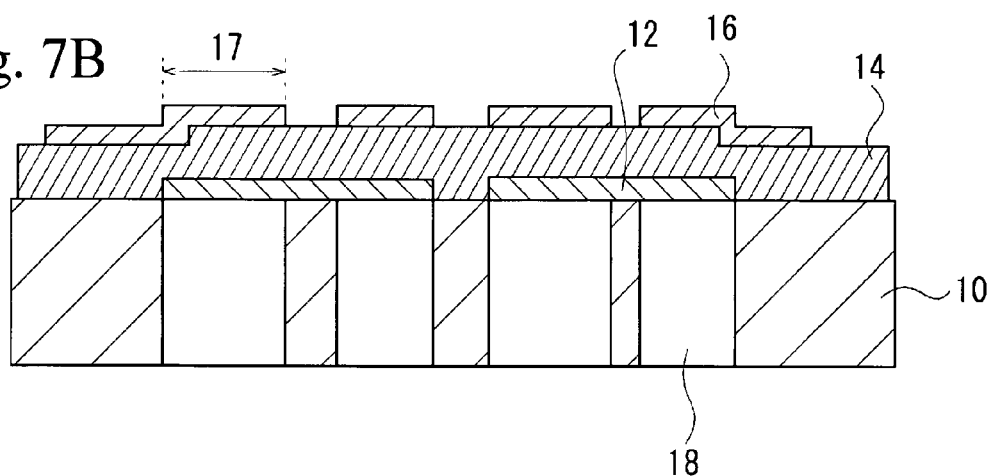
FIG. 7B is a cross-sectional view taken along a line A-A shown in FIG. 7A.

FIG. 7A is a plan view of the filter in accordance with the first embodiment, and FIG. 7B is a cross-sectional view taken along a line A-A shown in FIG. 7A. The lower electrode 12 may be made of ruthenium (Ru) and is provided on a substrate 10, which may be made of silicon. A piezoelectric substance 14, which may, for example, be an AlN thin film, is formed on the lower electrode 12. The upper electrode 16 may be made of ruthenium (Ru) and is provided on the piezoelectric substance 14. A hole 18 is formed in the substrate 10 and is located below a section 17 in which the upper electrode 16 overlaps with the lower electrode 12 paired with the upper electrode 16 across the piezoelectric substance 14.

The series resonators S1a, S1b, S2 and S3 are connected so that the electrodes of the adjacent resonators the c-axis orientation direction are at an identical potential. The parallel resonators P1 and P2 are connected so that the electrodes of these resonators in the c-axis orientation direction are at opposite potentials. The input terminal Tin, the output terminal Tout, and a ground terminal Gnd are bumps for flip-chip mounting.

Referring to FIG. 6 again, it is assumed that the secondary distortion voltages of the first resonator S1a and the second resonator S1b are denoted as V1a and V1b, respectively, and areas of the section 17 in which the upper electrode overlaps with the lower electrode 12 across the piezoelectric substance 14 in each of the resonators S1a and S1b are denoted as A1a and A1b, respectively. In a case where power is supplied to the terminal T2 from T1, the first resonator S1a is supplied with higher power than that supplied to the second resonator S1b. Thus, in case where the area A1a of the first resonator S1a is equal to the area A1b of the second resonator S1b, the secondary distortion voltage V1a of the first resonator S1a is greater than the secondary distortion voltage V1b of the second resonator S1b. This causes a secondary distortion. With the above in mind, the areas A1a of the first series resonator S1a and the area A1b of the second series resonator S1b are set different from each other. With this setting, it is possible to suppress the secondary distortion by appropriately setting the areas A1a and A1b even if the secondary distortion voltages V1a and V1b differ from each other. The area A1a of a specific one of the first resonator S1a and the second resonator S1b to which power is supplied (such a specific resonator is the first resonator S1a in FIG. 6) is set greater than the area A1b of the other resonator (second resonator S1b in FIG. 6). With this relationship, it is possible to set the secondary distortion voltage V1a of the first resonator S1a and the secondary distortion voltage V1b of the second resonator S1b equal to an identical value. The secondary voltages V1a and V1b can be canceled, so that the whole secondary distortion can be suppressed.

Fourth Embodiment

Figure 8:
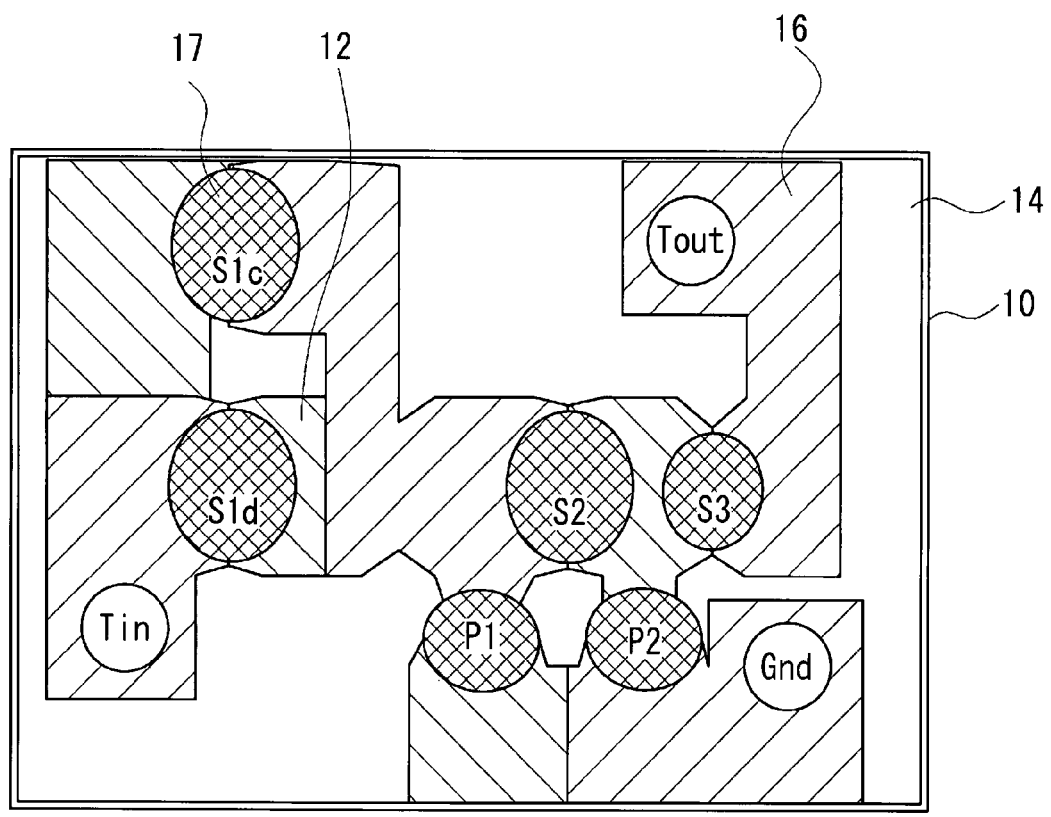
FIG. 8 is a plan view of a filter of a fourth embodiment.

A fourth embodiment is an exemplary ladder type filter in which an FBAR is divided into parts connected in parallel. Referring to FIG. 8, the series resonator S1 is divided into a first resonator S1c and a second resonator S1d connected in parallel. The first resonator S1c and the second resonator S1d are connected so that the electrodes of these resonators in the c-axis orientation direction are at opposite potentials. That is, the lower electrode 12 of the first resonator S1c is located at the side of the input terminal Tin, and the upper electrode 16 is located at the side of the output terminal Tout. The upper electrode 16 of the second resonator S1d is located at the side of the input terminal Tin, and the lower electrode 12 thereof is located as the side of the output terminal Tout. The other structures of the fourth embodiments are the same as those of the second embodiment.

According to the fourth embodiment, the secondary distortion voltages of the first resonator S1c and the second resonator S1d are canceled as in the case of FIG. 5B, so that the second distortion can be suppressed. The section 17 of the first resonator S1c and that of the second resonator S1d have an identical area. As has been described, the upper electrode 16 overlaps with the lower electrode 12 across the piezoelectric substance 14 in the section 17. The secondary distortion voltage of the first resonator S1c and that of the second resonator S1d can be canceled.

In the third and fourth embodiments, the surface acoustic devices of the first or second embodiment are connected to the input terminal Tin. The secondary distortion voltages of the resonators to which highest power is applied can be canceled, so that the filter having reduced secondary distortion can be provided. The acoustic wave devices of the first or second embodiment may be connected to the output terminal Tout. Further, the arrangement shown in FIG. 6 may be varied so that the series resonator S2 between nodes N1 and N2 is divided into multiple FBARs of the first or second embodiment instead of the series resonator S1 between the input terminal Tin and the node N1. It is also possible to divide the resonator P1, P2 or S3 into multiple FBARs of the first or second embodiment. The resonator P1 is connected between the node N1 and ground, and the resonator P2 is connected between the node N2 and ground. The resonator S3 is connected between the node N2 and the output terminal Tout. In this manner, the secondary distortion can be suppressed by using the divided acoustic devices of the first or second embodiment between the adjacent nodes or between the node and ground in the ladder structure.

Fifth Embodiment

Figure 9:
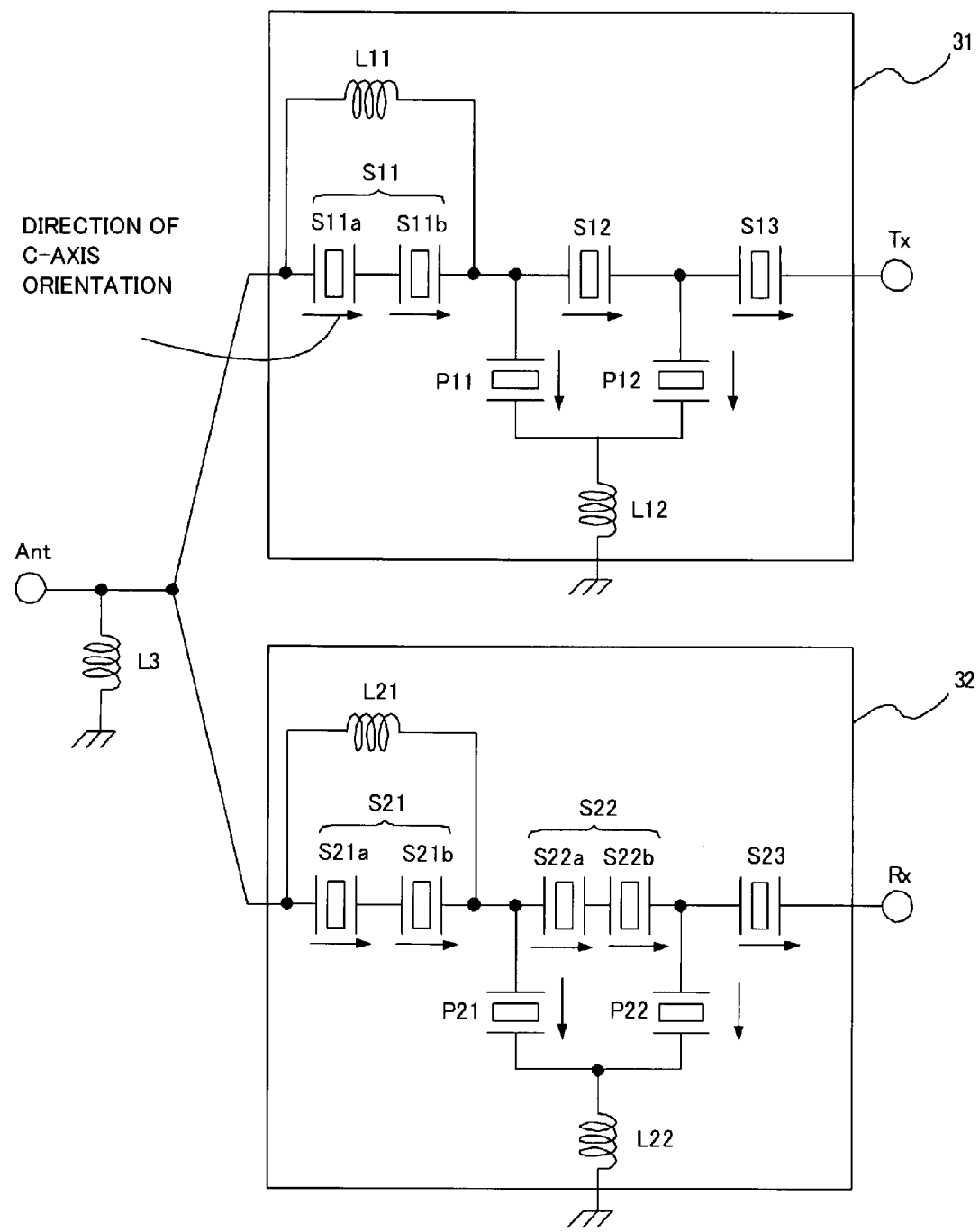
FIG. 9 is a circuit diagram of a duplexer of a fifth comparative example.
Figure 10:
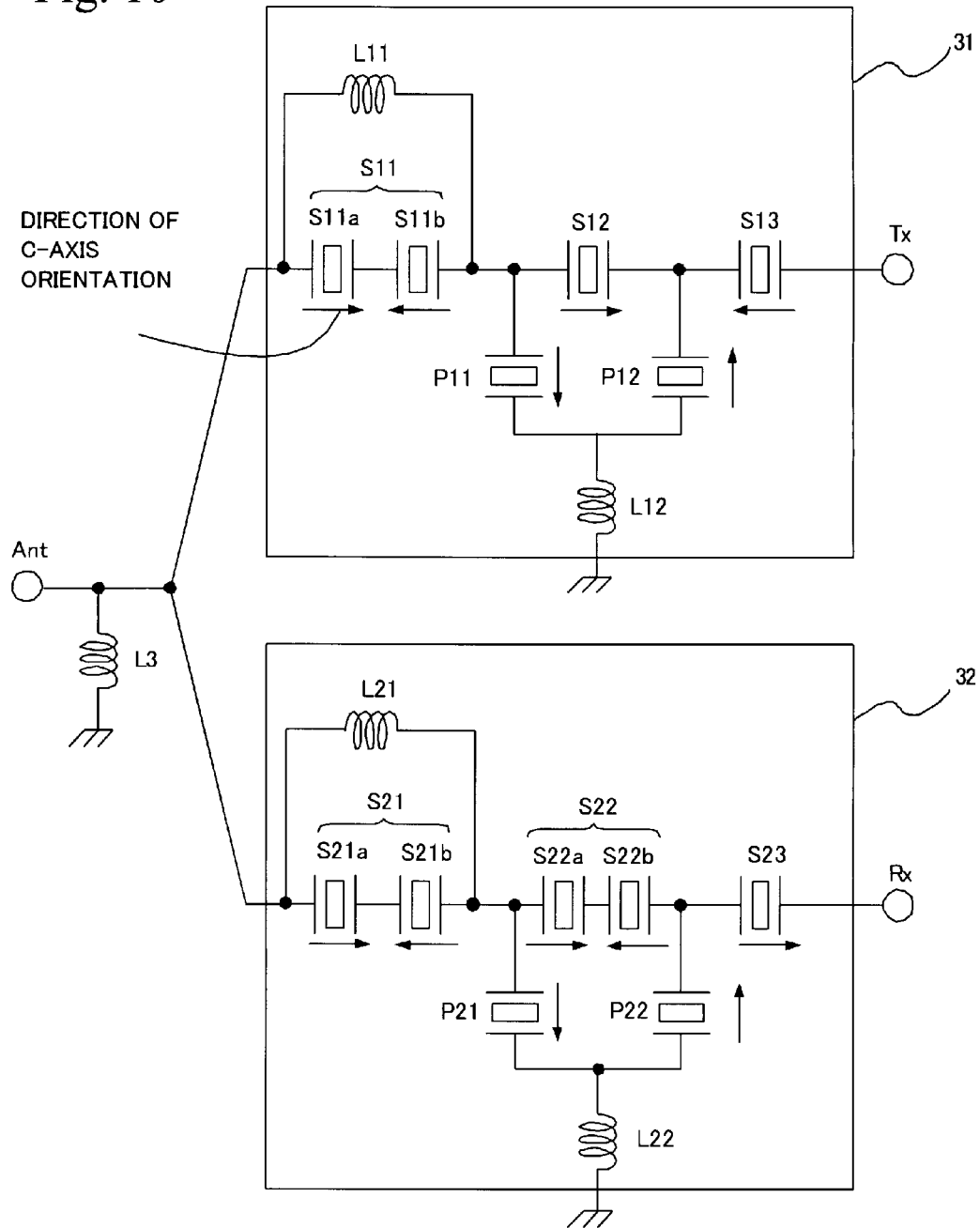
FIG. 10 is a circuit diagram of a duplexer of a fifth embodiment.

A fifth embodiment is a duplexer using filters, each of which is configured in accordance with the third embodiment. FIG. 9 is a circuit diagram of a duplexer of a fifth comparative example, and FIG. 10 is a circuit diagram of a duplexer of the fifth embodiment. A first filter 31, which functions as a transmission filter, is connected between a common terminal Ant and a transmission terminal Tx. A second filter 32, which functions as a reception filter, is connected between the common terminal Ant and a reception terminal Rx. An inductor L3 is connected to the common terminal Ant and ground. In the first filter 31, the series resonator S11 closest to the common terminal Ant among the series resonators S11, S12 and S13 is divided into series resonators S11a and S11b connected in series. An inductor L11 is connected in parallel with the series circuit of the resonators S11a and S11b. The inductor L11 cooperates with the inductor L3 to function as a matching circuit that matches the impedance of the first filter 31 and that of the second filter 32 viewed from the common terminal Ant with each other. Further, the inductor L11 functions to increase attenuation in the pass band of the other filter 32. The parallel resonators P11 and P12 are connected to ground via an inductor L12, which functions to increase attenuation in the pass band of the other filter 32.

In the second filter 32, the series resonator S21 among the series resonators S21, S22 and S23 is divided into a first resonator S21a and a second resonator S21b. Further, the series resonator S22 is divided into a first resonator S22a and a second resonator S22b. The other structures of the second filter 32 are the same as those of the first filter 31. Arrows shown below or side of symbols of the resonators indicate the c-axis orientation direction of the piezoelectric substance. In the fifth comparative example, the first resonator S11a and the second resonator S11b form the acoustic wave device of the first comparative example, and the first resonator S21a and the second resonator S21b form the first comparative example. Further, the first resonator S22a and the second resonator S22b form the first comparative example. All the series resonators are arranged so that the resultant secondary distortion voltage is increased, and all the parallel resonators are arranged so that the resultant secondary distortion voltage is increased.

Referring to FIG. 10, the fifth embodiment has the same configuration as the fifth comparative example except the following. The first resonator S11a and the second resonator S11b form the acoustic wave device of the first embodiment, and the first resonator S21a and the second resonator S21b form the acoustic wave device of the first embodiment. Further, the first resonator S22a and the second resonator S22b form the acoustic wave device of the first embodiment. In addition, all the series resonators are arranged so as to cancel the secondary distortion voltages. Similarly, all the parallel resonators are arranged so that the secondary distortion voltages can be canceled.

Figure 11:
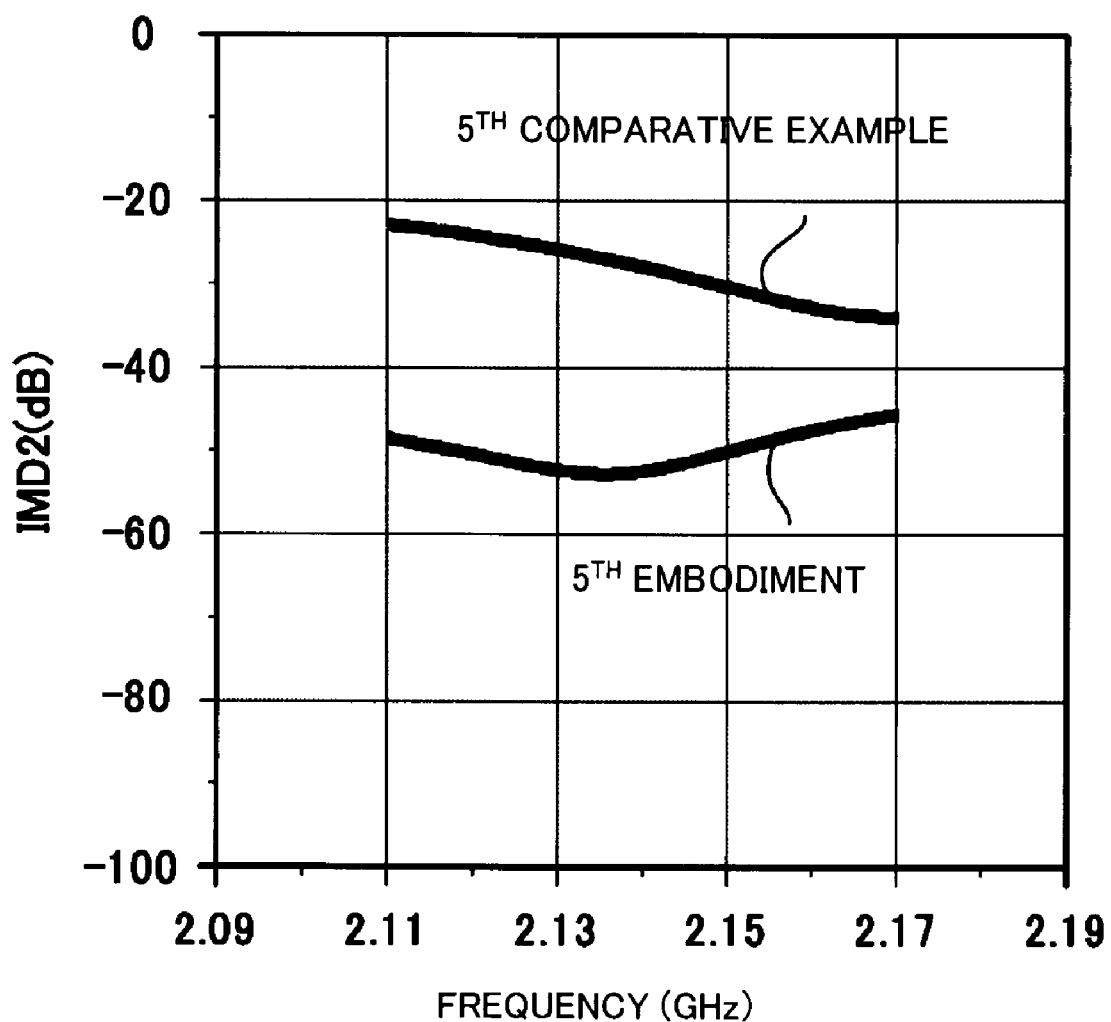
FIG. 11 shows IMD2 of the fifth comparative example and that of the fifth embodiment.

FIG. 11 relates to the fifth comparative example and the fifth example, and is a graph of power of the secondary distortion (IMD2) that is output via the receive terminal Rx as a function of frequency when an input signal having a frequency of 1920 to 1980 MHz and a power of 25 dBm is applied to the transmission terminal Tx and a disturbance wave having a frequency of 4020 to 4150 MHz and a power of 21 dBm is applied to the receive terminal Rx. There is difficulty in discussion about the absolute value of the calculated IMD2, whereas a discussion about the relative value of IMD2 can be made. FIG. 11 shows that the value of IMD2 of the fifth embodiment is smaller than that of the fifth comparative example. It is possible to suppress the secondary distortion by setting the c-axis orientation direction of the piezoelectric substance so that the secondary distortion voltages of the divided resonators connected in series, the divided series resonators or the divided parallel resonators can be canceled.

Sixth Embodiment

Figure 12:
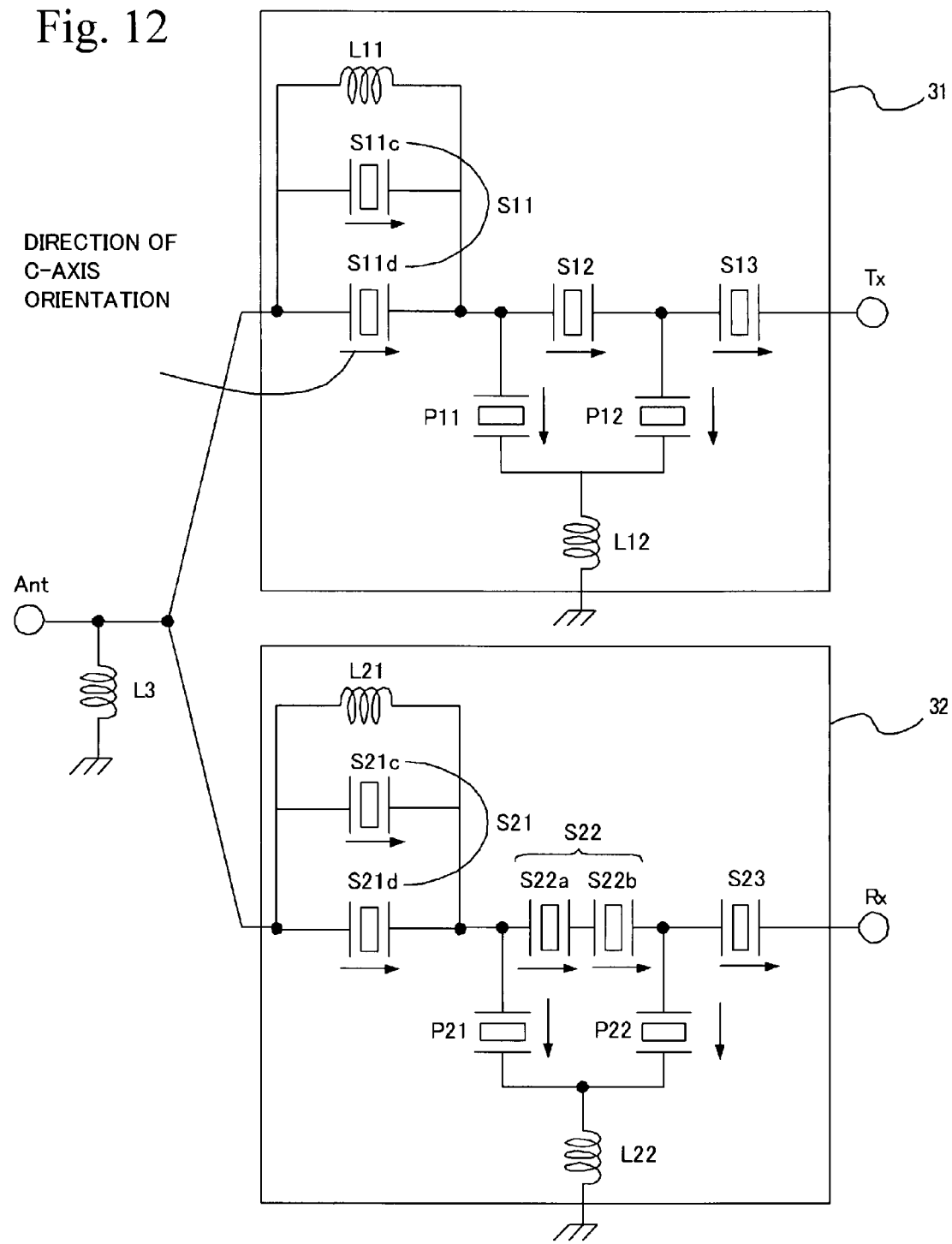
FIG. 12 is a circuit diagram of a duplexer of a sixth comparative example.
Figure 13:
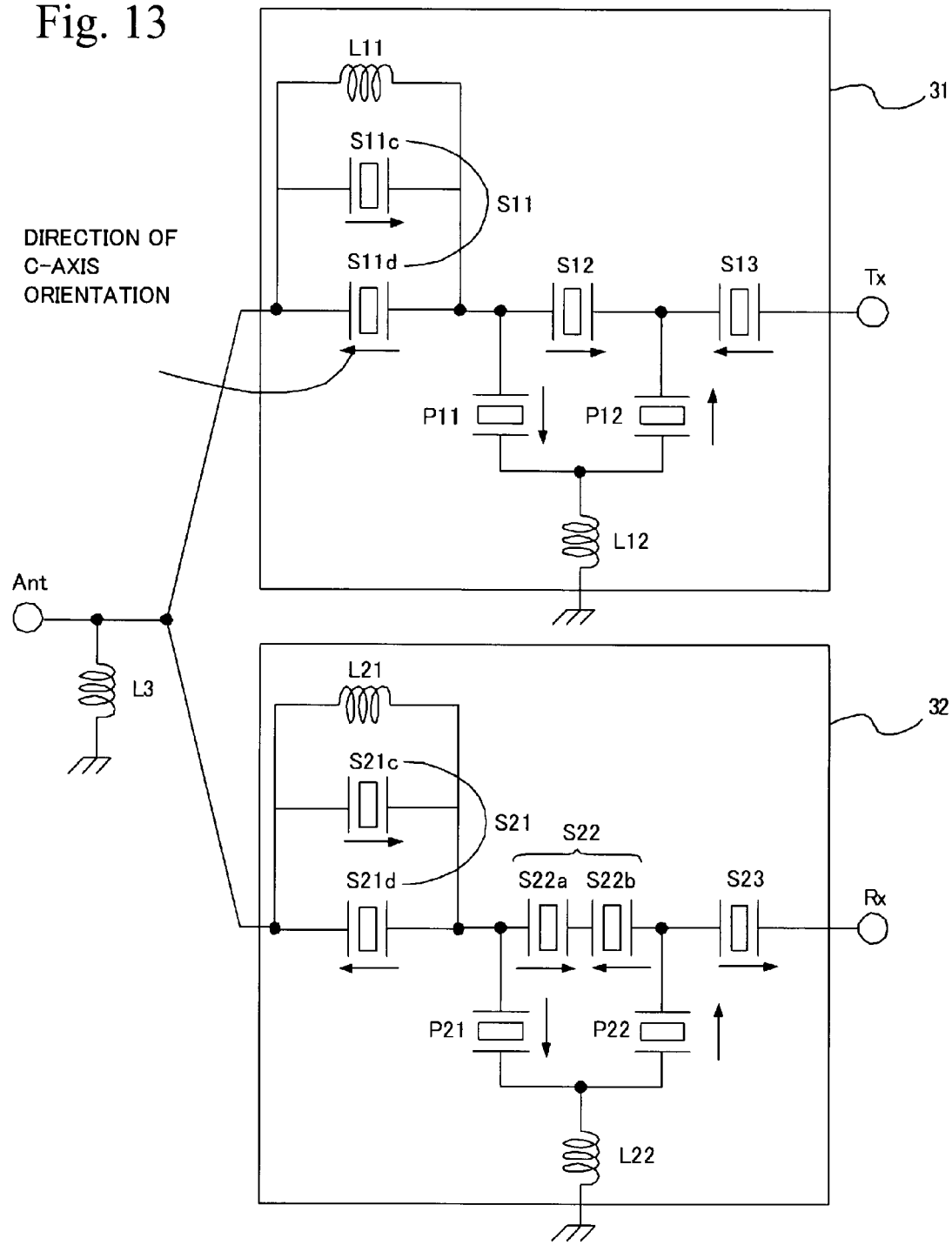
FIG. 13 is a circuit diagram of a duplexer of a sixth embodiment.

A sixth embodiment is a duplexer using filters of the fourth embodiment. FIG. 12 is a circuit diagram of a duplexer of a sixth comparative example, and FIG. 13 is a circuit diagram of a duplexer of the sixth embodiment. The sixth comparative example differs from the fifth comparative example in which the series resonator S11 of the first filter 31 is divided into a first resonator S11c and a second resonator S11d connected in parallel. Similarly, the series resonator S21 of the second filter 32 of the sixth comparative example is divided into a first resonator S21c and a second resonator S21d connected in parallel. The first resonator S11c and the second resonator S11d form the acoustic wave device of the second comparative example, and the first resonator S21c and the second resonator S21d form the acoustic wave device of the second comparative example. The other structures of the sixth comparative example are the same as those of the fifth comparative example.

Referring to FIG. 13, the sixth embodiment differs from the fifth embodiment in which the series resonator S11 of the first filter 31 is divided into a first resonator S11c and a second resonator S11d connected in parallel. Similarly, the series resonator S21 of the second filter 32 of the sixth embodiment is divided into a first resonator S21c and a second resonator S21d connected in parallel. The first resonator S11c and the second resonator S11d form the acoustic wave device of the second embodiment, and the first resonator S21c and the second resonator S21d form the acoustic wave device of the second embodiment. The other structures of the sixth embodiment are the same as those of the fifth embodiment.

Figure 14:
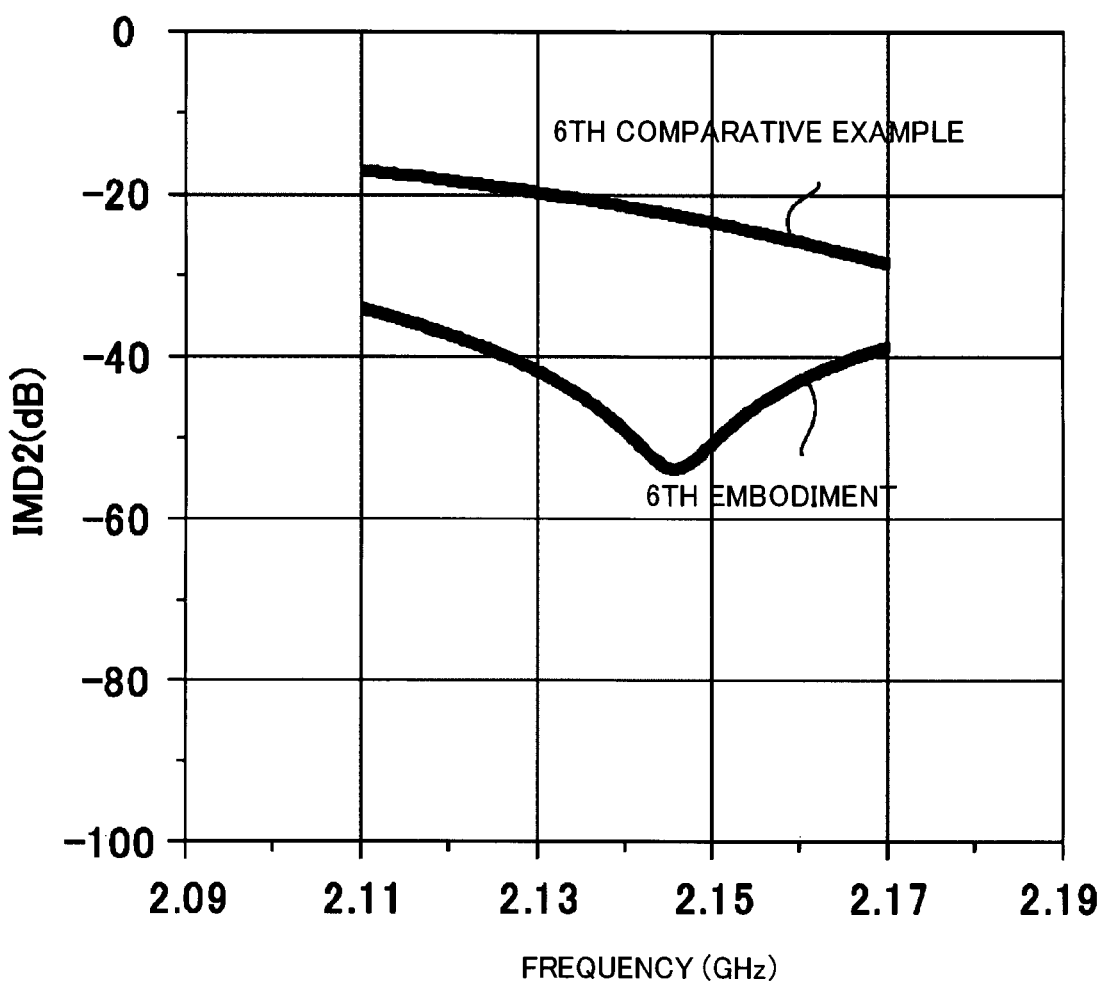
FIG. 14 shows IMD2 of the sixth comparative example and that of the sixth embodiment.

FIG. 14 relates to the sixth comparative example and the sixth example, and is a graph of power of the secondary distortion (IMD2) that is output via the receive terminal Rx as a function of frequency for the same conditions as those of the case shown in FIG. 11. There is difficulty in discussion about the absolute value of the calculated IMD2, whereas a discussion about the relative value of IMD2 can be made. FIG. 14 shows that the value of IMD2 of the sixth embodiment is smaller than that of the sixth comparative example. It is possible to suppress the secondary distortion by setting the c-axis orientation direction of the piezoelectric substance so that the secondary distortion voltages of the divided resonators connected in parallel can be canceled.

In the first through sixth embodiments, the resonator of interest is divided into two, namely, the first and second resonators. However, the resonator may be divided into three or more. In this case, the areas of the sections in which the upper electrode overlaps with the lower electrode across the piezoelectric substance in the divided resonators are determined so as to cancel the secondary distortion voltages. It is thus possible to suppress secondary distortion.

The first through sixth embodiments employ the FBARs using a piezoelectric substance of AlN, which may be replaced by ZnO or another appropriate piezoelectric substance. When another piezoelectric substance is used, the first through sixth embodiments are varied so that the c-axis orientation is replaced by a polarization axis. These variations are capable of suppressing secondary distortion as in the case of the first through sixth embodiments. SMRs may be substituted for the FBARs. The present invention includes not only piezoelectric thin-film resonators but also acoustic wave devices having a piezoelectric film sandwiched by a pair of electrodes.

Seventh Embodiment

Figure 15A:
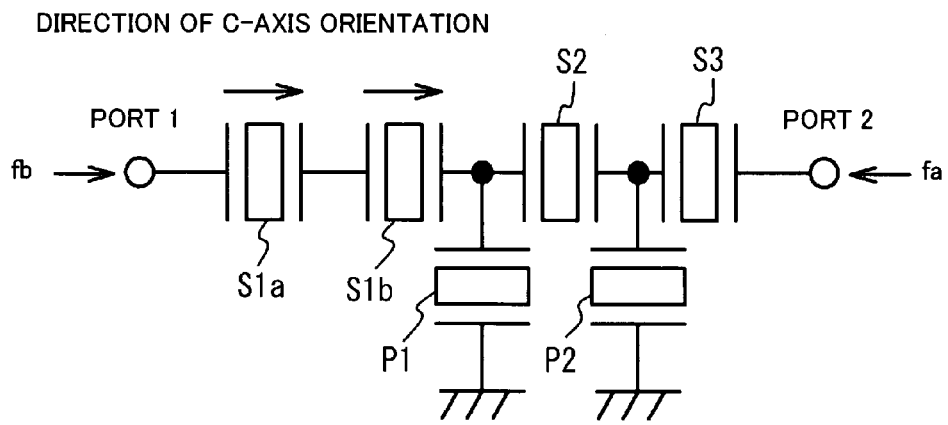
FIG. 15A is a circuit diagram of a filter of a seventh comparative example.
Figure 16A:
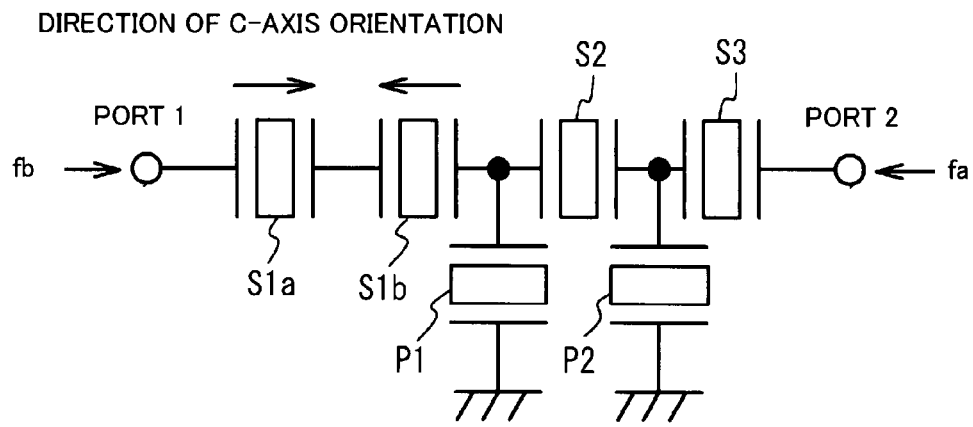
FIG. 16A is a circuit diagram of a filter of a seventh embodiment.

A seventh comparative example and a seventh embodiment are ladder-type filters in which one of the series resonators is divided into resonators connected in series like the third embodiment. FIG. 15A is a circuit diagram of the ladder filter of the seventh comparative example, and FIG. 16A is a circuit diagram of the ladder filter of the seventh embodiment. Each of the seventh comparative example and embodiment has series resonators S1 through S3 connected in series between ports 1 and 2, and parallel resonators P1 and P2 as in the case of the third embodiment. The series resonator S1 is divided into the first resonator S1a and S1b. The polarities of the first and second resonators S1a and S1b in the seventh comparative example differ from those of the first and second resonators S1a and S1b in the seventh embodiment. In the seventh comparative example, the first and second resonators S1a and S1b are connected so that the electrode of one of the two resonators in the c-axis orientation direction has the same potential as that of the electrode of the other resonator in the reverse direction of the c-axis orientation direction. That is, the first and second resonators S1a and S1b are connected as shown in FIG. 4A. In the seventh embodiment, as shown in FIG. 16A, the first and second resonators S1a and S1b are connected so that the electrodes of the two resonators in the c-axis orientation direction are at an identical potential. That is, the first and second resonators S1a and S1b are connected as shown in FIG. 4B.

Figure 15B:
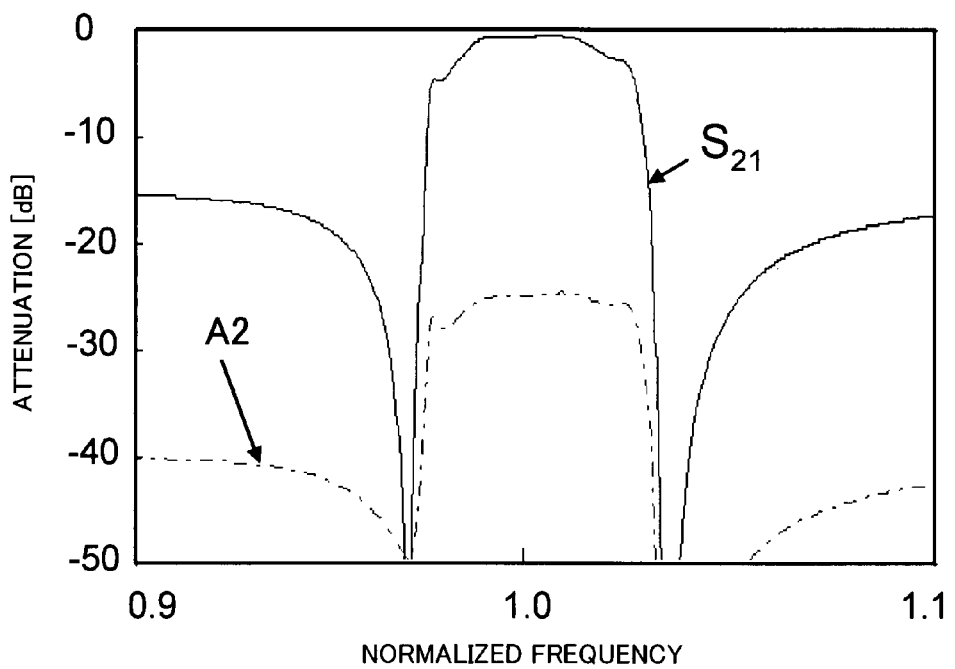
FIG. 15B shows a bandpass characteristic and IMD2 of the seventh comparative example.
Figure 16B:
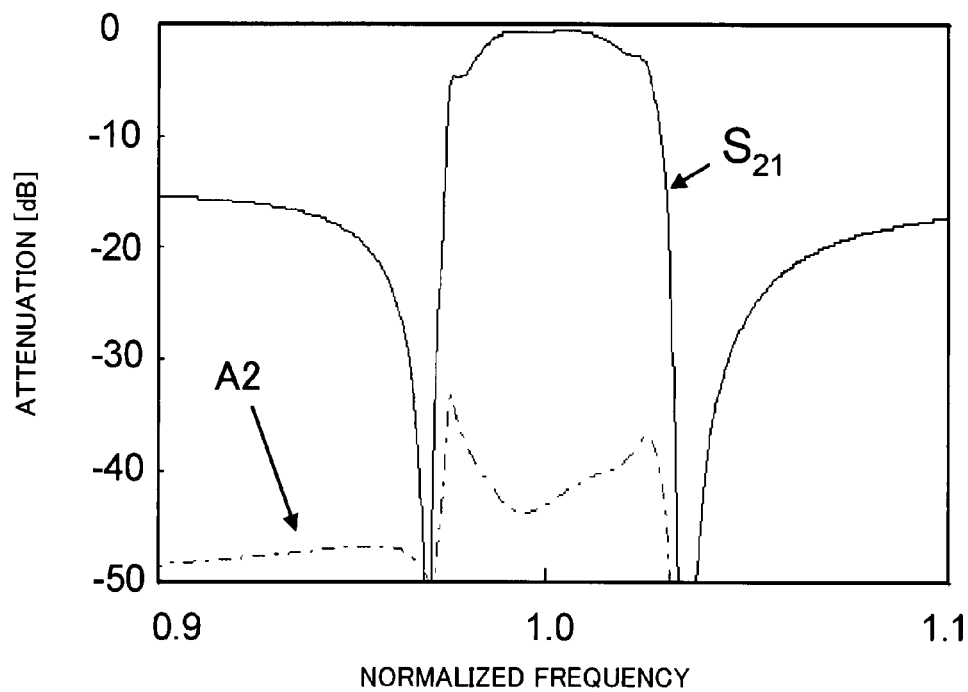
FIG. 16B shows a bandpass characteristic and IMD2 of the seventh embodiment.

FIG. 15B shows the bandpass characteristic and IMD2 of the seventh comparative example as a function of normalized frequency. FIG. 16B shows the bandpass characteristic and IMD2 of the seventh embodiment as a function of normalized frequency. In these figures, a symbol S21 indicates the bandpass characteristic. A signal of a frequency fa ranging from 800 MHz to 1200 MHz is applied to port 2, and a disturbance wave of a frequency fb of 300 MHz is applied to port 1. A curve indicated by A2 is IMD2 (having a frequency equal to fa+fb) output via port 2.

It can be seen from FIGS. 15B and 16B that the seventh embodiment and the seventh comparative example have almost the same pass-bands, while the seventh embodiment is capable of suppressing IMD2 more effectively than the seventh comparative example.

Eighth Embodiment

Figure 17A:
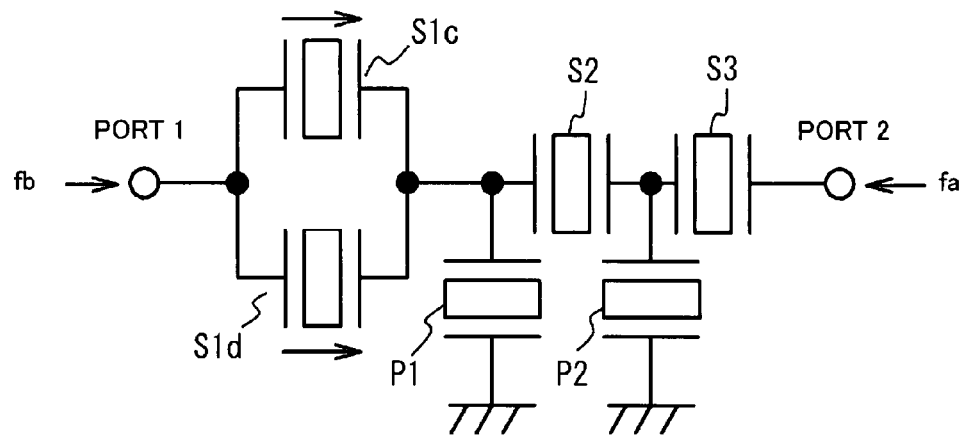
FIG. 17A is a circuit diagram of a filter of an eighth comparative example.
Figure 18A:
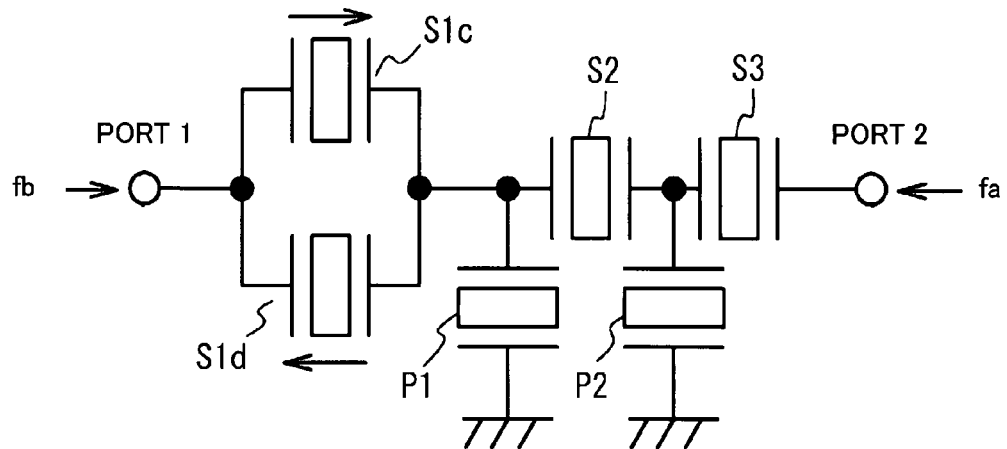
FIG. 18A is a circuit diagram of a filter of an eighth embodiment.

An eight embodiment and an eighth comparative example are ladder type filters in which one of the series resonators is divided into resonators connected in parallel. FIG. 17A is a circuit diagram of the ladder type filter of the eighth comparative example, and FIG. 18A is a circuit diagram of the ladder type filter of the eighth embodiment. In each of the eighth comparative example and embodiment, the resonator S1 is divided into resonators S1c and S1d connected in parallel. The eighth embodiment has polarities of the resonators S1c and S1d different from those of the eighth comparative example. That is, in the eighth comparative example, the first and second resonators S1c and S1d are connected in parallel so that the electrodes of these resonators in the c-axis orientation direction are at an identical potential, as shown in FIG. 5A. In contrast, in the eighth embodiment shown in FIG. 18A, the first and second resonators S1c and S1d are connected in parallel so that the electrodes of these resonators in the c-axis orientation direction are at opposite potentials, as shown in FIG. 5B. The other structures of the eighth embodiment are the same as those of the seventh embodiment.

Figure 17B:
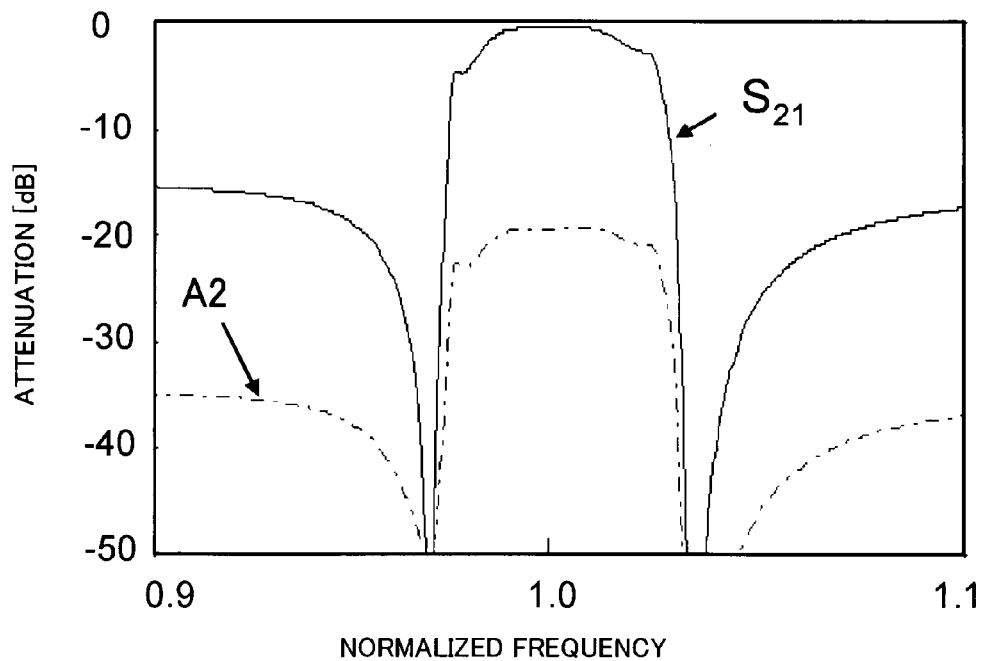
FIG. 17B shows a bandpass characteristic and IMD2 of the eighth comparative example.
Figure 18B:
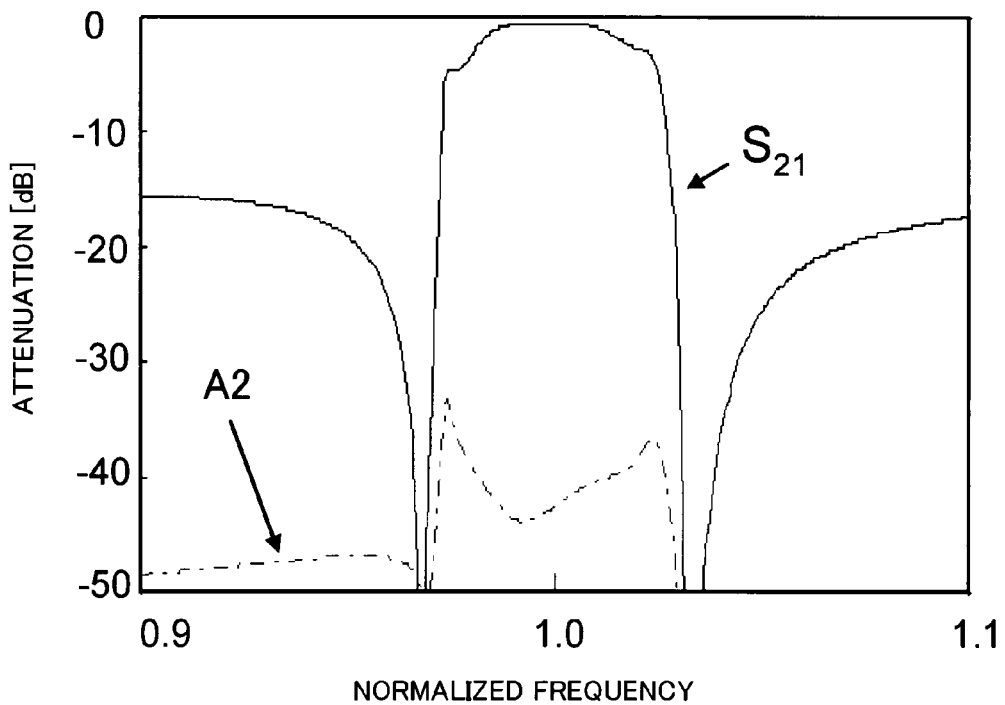
FIG. 18B shows a bandpass characteristic and IMD2 of the eighth embodiment.

FIG. 17B shows the bandpass characteristic and IMD2 of the eighth comparative example as a function of normalized frequency. FIG. 18B shows the bandpass characteristic and IMD2 of the eight embodiment as a function of normalized frequency. In these figures, symbols S21 and A2 are the same as those defined as described previously in connection with the seventh comparative example and embodiment.

It can be seen from FIGS. 17B and 17B that the eighth embodiment and the eighth comparative example have almost the same pass-bands, while the eighth embodiment is capable of suppressing IMD2 more effectively than the eighth comparative example.

Ninth Embodiment

Figure 19:
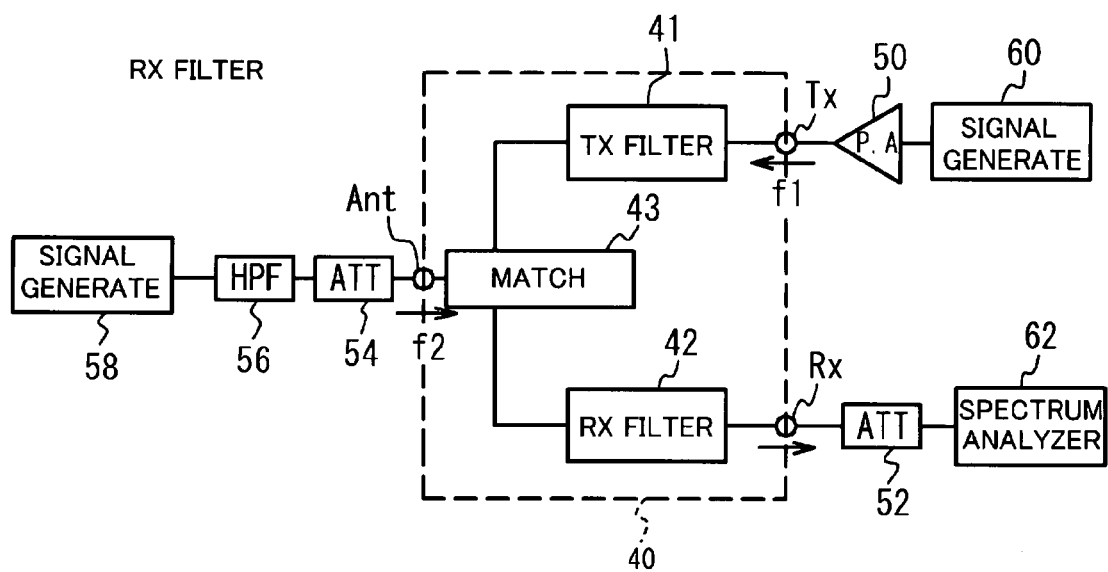
FIG. 19 is a block diagram of a duplexer of a ninth embodiment and a measurement system for measuring IMD2 of the duplexer.

A ninth embodiment is a duplexer. FIG. 19 is a block diagram of a duplexer 40 in accordance with the ninth embodiment and a measurement instrument. The duplexer 40 includes a transmission filter 41, a reception filter 42 and a matching circuit 43. The matching circuit 43 is connected to the common terminal Ant, and the transmission filter 41 is connected between the matching circuit 43 and the transmission terminal Tx. The reception filter 42 is connected between the matching circuit 43 and the reception terminal Rx. The duplexer 40 is suitably designed for 2.1 GHz W-CDMA in which the transmission frequency ranges from 1920 MHz to 1980 MHz and the reception frequency ranges from 2110 MHz to 2170 MHz. The inventors produced four different types of samples in which the transmission filters 41 are formed by the seventh comparative example, the seventh embodiment, the eighth comparative example, and the eighth embodiment. The other structures of the four samples are the same. The transmission filters 41 and the reception filters 42 of the samples are formed by FBARs as shown in FIG. 7A, 7B or 8. The holes 18 are formed below the sections 17 in which the upper electrodes 16 overlap with the corresponding lower electrodes 12 across the piezoelectric substance 14, as shown in FIG. 7B.

The IMD2 of the four different types of samples was measured as follows. Referring to FIG. 19, a signal generator 60 generates the transmission signal of the frequency f1 ranging from 1920 MHz to 1980 MHz. A power amplifier 50 amplifies the transmission signal and applies the amplified signal to the transmission terminal Tx. The gain of the power amplifier 50 is adjusted so that the output power via the common terminal Ant is equal to 21 dBm. A signal generator 58 generates the disturbance wave of the frequency f2 ranging from 4030 MHz to 4150 MHz. A high-pass filter (HPF) 56 removes low-frequency components from the disturbance wave. An attenuator (ATT) 54 limits the amplitude of the filtered disturbance signal to a given level, so that the disturbance wave with a power of −15 dBm is applied to the common terminal Ant. In this state, an IMD2 signal of 2110 MHz to 2170 MHz is output via the reception terminal Rx and an attenuator (ATT) 52, and is measured by a spectrum analyzer 62.

Figure 20:
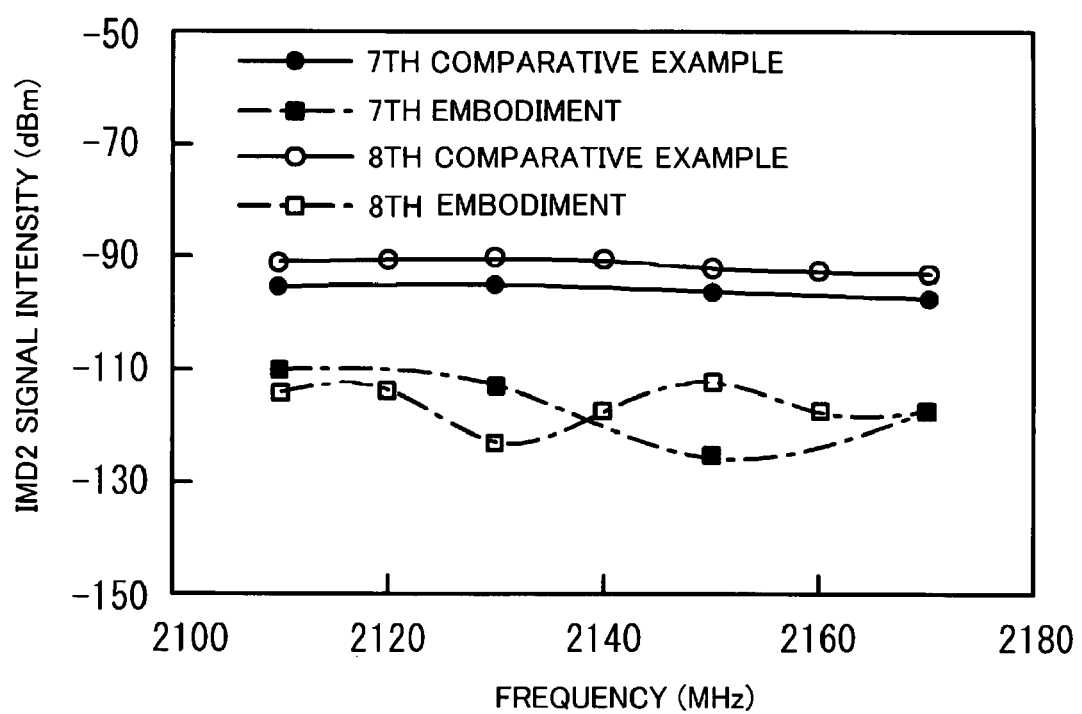
FIG. 20 shows IMD2 of the duplexer of the ninth embodiment.

FIG. 20 shows the IMD2 signal intensity (dBm) of the four types of samples as a function of frequency (MHz). The IMD2 signal intensities obtained by using the transmission filters 41 of the seventh and eight embodiments are approximately 20 dBm less than those obtained by using the transmission filters 41 of the seventh and eighth comparative examples. The duplexers 40 of the ninth embodiment with the transmission filters of the seventh and eighth embodiments have a capability of suppressing IMD2.

The present invention is not limited to the specifically disclosed embodiments but other embodiments and variations may be made without departing from the scope of the present invention.

The present application is based on Japanese Patent Application Nos. 2006-237287 filed on Sep. 1, 2006 and 2007-187666 filed on Jul. 18, 2007, and the entire disclosure of which is hereby incorporated by reference.

What is claimed is:

1. An acoustic wave device comprising;
   a first resonator having a piezoelectric substance sandwiched between a pair of electrodes in a direction of an c-axis orientation or a polarization axis; and
   a second resonator that is connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis;
   wherein the first resonator has a section in which the pair of electrodes overlaps across the piezoelectric substance has an area different from that of another section of the second resonator in which the another pair of electrodes overlaps across the another piezoelectric substance.

2. The piezoelectric wave device as claimed in claim 1, wherein the first resonator is supplied with power and the area of the section of the first resonator is greater than that of the another section of the second resonator.

3. A duplexer comprising:
   a common terminal;
   a first filter which functions as a transmission fitter and is connected to the common terminal; and
   a second filter which functions as a reception filter and is connected to the common terminal,
   each of the first filter and the second filter having acoustic wave resonators including a specific acoustic wave resonator connected to the common terminal and including:
   a first resonator having a piezoelectric substance sandwiched between a pair of electrodes in a direction of an c-axis orientation or a polarization axis; and
   a second resonator that is
   connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis;
   wherein the piezoelectric substance of the first resonator and the second resonator are made of the same piezoelectric film.

4. The duplexer as claimed in claim 3, wherein the first resonator has a section in which the pair of electrodes overlaps across the piezoelectric film has an area equal to that of another section of the second resonator in which the another pair of electrodes overlaps across the another piezoelectric film.

5. The duplexer as claimed in claim 3, wherein the first and second resonators are resonators in which the piezoelectric film has a thickness equal to half wavelengths of respective resonance frequencies.

6. The duplexer as claimed in claim 3, wherein the piezoelectric film includes AlN or ZnO.

7. A duplexer comprising:
   a common terminal;
   a first filter which functions as a transmission filter and is connected to the common terminal and is a ladder type filter; and
   a second filter which functions as a reception filter and is connected to the common terminal and is a ladder type filter,
   each of the first filter and the second filter having acoustic wave resonators including a specific acoustic wave resonator including:
   a first resonator having a piezoelectric substance sandwiched between a pair of electrodes in a direction of an c-axis orientation or a polarization axis; and
   a second resonator that is one of
   connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis, or
   connected in parallel with the first resonator and has another piezoelectric substance sandwiched between another pair of electrodes so that one of the another pair of electrodes located in the direction of the c-axis orientation or the polarization axis is at a potential opposite to that of one of the pair of electrodes of the first resonator in the direction of the c-axis orientation or the polarization axis,
   wherein a first series resonator closest to the common terminal among series resonators of each of the first filter and the second filter is the specific acoustic wave resonator, and any parallel resonators are not connected between the common terminal and the first series resonator.

8. A duplexer comprising;
   a common terminal;
   a first filter which functions as a transmission filter and is connected to the common terminal; and
   a second filter which functions as a reception filter and is connected to the common terminal and is a ladder type filter,
   the second filter having acoustic wave resonators including a specific acoustic wave resonator including:
   a first resonator having a piezoelectric substance sandwiched between a pair of electrodes in a direction of an c-axis orientation or a polarization axis; and
   a second resonator that is one of
   connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis, or
   connected in parallel with the first resonator and has another piezoelectric substance sandwiched between another pair of electrodes so that one of the another pair of electrodes located in the direction of the c-axis orientation or the polarization axis is at a potential opposite to that of one of the pair of electrodes of the first resonator in the direction of the c-axis orientation or the polarization axis,
   wherein each of a first series resonator closest to the common terminal among series resonators of the second filter and a second series resonator second closest to the common terminal among the series resonators of the second filter is the specific acoustic wave resonator, and any parallel resonators are not connected between the common terminal and the first series resonator.

9. The duplexer as claimed in claim 8, wherein:
the first filter is a ladder type filter; and
only a first series resonator closest to the common terminal among series resonators of the first filter is the specific acoustic wave resonator, and any parallel resonators are not connected between the common terminal and the first series resonator of the first filter.

10. The duplexer as claimed in claim 8, wherein:
each of the second resonator of the first series resonator and the second series resonator is connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis.

11. The duplexer as claimed in claim 8, wherein:
the second resonator of the first series resonator is connected in parallel with the first resonator and has another piezoelectric substance sandwiched between another pair of electrodes so that one of the another pair of electrodes located in the direction of the c-axis orientation or the polarization axis is at a potential opposite to that of one of the pair of electrodes of the first resonator in the direction of the c-axis orientation or the polarization axis; and
the second resonator of the second series resonator is connected in series with the first resonator and has another piezoelectric substance sandwiched between another pair of electrodes so that one of the another pair of electrodes located in the direction of the c-axis orientation or the polarization axis is at a potential equal to that of one of the pair of electrodes of the first resonator in the direction of the c-axis orientation or the polarization axis.

* * * * *